United States Patent
Hamlet et al.

(10) Patent No.: US 9,218,444 B2
(45) Date of Patent: Dec. 22, 2015

(54) APPROXIMATE CIRCUITS FOR INCREASED RELIABILITY

(71) Applicant: Sandia Corporation, Albuquerque, NM (US)

(72) Inventors: Jason R. Hamlet, Albuquerque, NM (US); Jackson R. Mayo, Livermore, CA (US)

(73) Assignee: Sandia Corporaton, Albuquerque, NM (US)

( * ) Notice: Subject to any disclaimer, the term of this patent is extended or adjusted under 35 U.S.C. 154(b) by 0 days.

(21) Appl. No.: 14/792,109

(22) Filed: Jul. 6, 2015

(65) Prior Publication Data

US 2015/0324497 A1 Nov. 12, 2015

Related U.S. Application Data

(62) Division of application No. 14/052,896, filed on Oct. 14, 2013, now Pat. No. 9,112,490.

(51) Int. Cl.
*G06F 17/50* (2006.01)

(52) U.S. Cl.
CPC .................. *G06F 17/505* (2013.01)

(58) Field of Classification Search
CPC ...................................... G06F 17/505
USPC .................................................. 716/100–107
See application file for complete search history.

(56) References Cited

U.S. PATENT DOCUMENTS 8,640,063 B1* 1/2014 El-Maleh .............. G06F 17/505
716/104

* cited by examiner

*Primary Examiner* — Paul Dinh
(74) *Attorney, Agent, or Firm* — Blakely, Sokoloff, Taylor & Zafman LLP

(57) ABSTRACT

Embodiments of the invention describe a Boolean circuit having a voter circuit and a plurality of approximate circuits each based, at least in part, on a reference circuit. The approximate circuits are each to generate one or more output signals based on values of received input signals. The voter circuit is to receive the one or more output signals generated by each of the approximate circuits, and is to output one or more signals corresponding to a majority value of the received signals. At least some of the approximate circuits are to generate an output value different than the reference circuit for one or more input signal values; however, for each possible input signal value, the majority values of the one or more output signals generated by the approximate circuits and received by the voter circuit correspond to output signal result values of the reference circuit.

11 Claims, 5 Drawing Sheets

APPROXIMATE CIRCUITS FOR INCREASED RELIABILITY

CROSS-REFERENCE TO RELATED APPLICATIONS

This application is a divisional application of, and discloses subject matter that is related to subject matter disclosed in, co-pending parent application U.S. Ser. No. 14/052,896, filed Oct. 14, 2013 and entitled "Approximate Circuits for Increased Reliability". The present application claims the priority of its parent application which is incorporated herein by reference in its entirety.

STATEMENT REGARDING FEDERALLY SPONSORED RESEARCH

This invention was developed under Contract DE-AC04-94AL85000 between Sandia Corporation and the U.S. Department of Energy. The U.S. Government has certain rights in this invention.

TECHNICAL FIELD

This disclosure relates generally to digital circuits, and in particular but not exclusively, relates to utilizing approximate circuits for increased reliability.

BACKGROUND INFORMATION

In storage and transmission circuitry, "soft errors" are erroneous changes to stored or transmitted data that occur during runtime (i.e., not a circuit design error). Soft errors are often caused by neutrons from cosmic rays and alpha particles emitted from integrated circuit packaging material (soft error sources), although other causes are also possible. For example, a soft error may occur when an alpha particle hits a transistor or logic gate and transfers a charge that alters a data value stored in the device or transmitted from the device; in other words, one or more bits may be "flipped" (i.e., change from 1-to-0 or from 0-to-1). As integrated circuit processes continue to shrink feature sizes, the resulting integrated circuits become more susceptible to soft errors; thus, there is a need for integrated circuits design features to ensure reliability in the presence of soft error sources.

SUMMARY OF INVENTION

Embodiments of the invention describe an integrated circuit having a voter circuit and a plurality of approximate circuits each based, at least in part, on a reference circuit. The approximate circuits are each to generate one or more output signals based on values of received input signals. The voter circuit is to receive the one or more output signals generated by each of the approximate circuits, and is to output one or more signals corresponding to a majority value of the received signals. At least some of the approximate circuits are to generate an output value different than the reference circuit for one or more input signal values; however, for each possible input signal value, the majority values of the one or more output signals generated by the approximate circuits and received by the voter circuit correspond to output signal result values of the reference circuit.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a system and method for utilizing approximate circuits to increase integrated circuit reliability are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Figure 1:
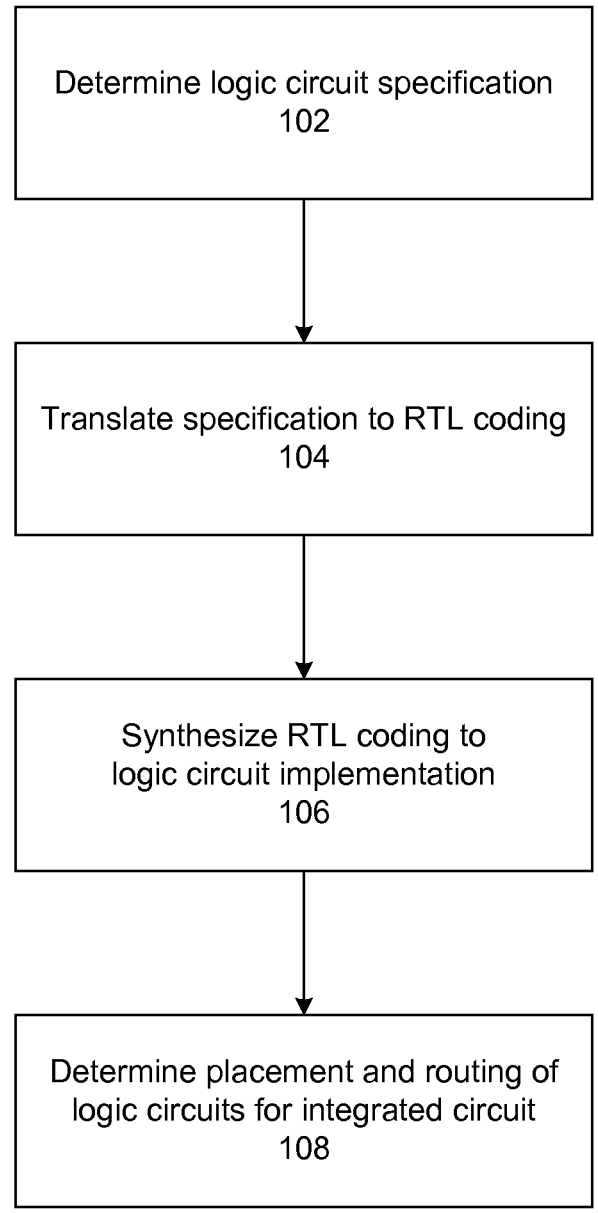
FIG. 1 is a flow diagram of a process for designing digital integrated circuits according to an embodiment of the disclosure.

FIG. 1 is a flow diagram of a process for designing digital integrated circuits according to an embodiment of the disclosure. Flow diagrams as illustrated herein provide examples of sequences of various process actions. Although shown in a particular sequence or order, unless otherwise specified, the order of the actions can be modified. Thus, the illustrated implementations should be understood only as examples, and the illustrated processes can be performed in a different order, and some actions may be performed in parallel. Additionally, one or more actions can be omitted in various embodiments of the invention; thus, not all actions are required in every implementation. Other process flows are possible.

Process 100 includes operations for determining a specification of a logic circuit or component, 102. A logic circuit specification defines the number of inputs a component is to receive, and output values corresponding to the plurality of input value combinations. The specification may be in the form of a hardware description language (HDL), such as Verilog or VHDL (Very high speed integrated circuit Hardware Description Language) or any other HDL coding form. This logic circuit specification is further translated to a register transfer language (RTL) description, 104. In some embodiments, the logic circuit specification includes signal and timing characteristics, and consistency between the specification and the RTL description is verified.

The RTL description is input into a tool so that it may be synthesized to a logic circuit implementation, 106. Synthesis tools may use scripts and/or a library of physical gate descriptions to create a logic gate level implementation of the RTL description. The synthesis tool may use standard cell implementations—i.e., a cell having a generally predefined size and designed to implement certain logic functions, for some components of the design.

The gate level synthesis is received by a place and route tool to determine placement of the cells (i.e., logic circuit components) within the resulting semiconductor integrated circuit design and signal routing between the cells, 108. At this stage, said circuit is sufficiently described in enough detail to produce a chip including the design.

For digital logic circuits, a soft error (alternatively referred to herein as a "transient error") may occur when an alpha particle hits a transistor device or logic gate and transfers a charge that alters a data value stored or transmitted; in other words, one or more bits may be "flipped" (i.e., change from 1-to-0 or from 0-to-1). During the above described gate level synthesis operations (i.e., operations 106 as described above), some components may be repeatedly instanced in order to increase reliability.

Triple modular redundancy (TMR) circuitry is a commonly used method for mitigating soft errors. For TMR, the logic component is implemented three times (i.e., in three separate modules), and the results generated by the three modules are compared; the two that are the same are considered to be correct, and the "dissenting vote" is thrown out. The drawbacks of TMR become severe as the logic component design becomes more complex. It may be expensive to implement a specific logic component design three times. Said logic component may have a large design, and tripling this specific implementation may greatly increase the overall circuit size. Furthermore, said logic component may also not be power efficient, and tripling the implementation increases the overall circuit power consumption.

Embodiments of the invention describe synthesis operations for producing a set of diverse approximate circuits. As referred to herein, "approximate circuits" are digital logic circuits that approximate the desired behavior described by the circuit designer.

Figure 2:
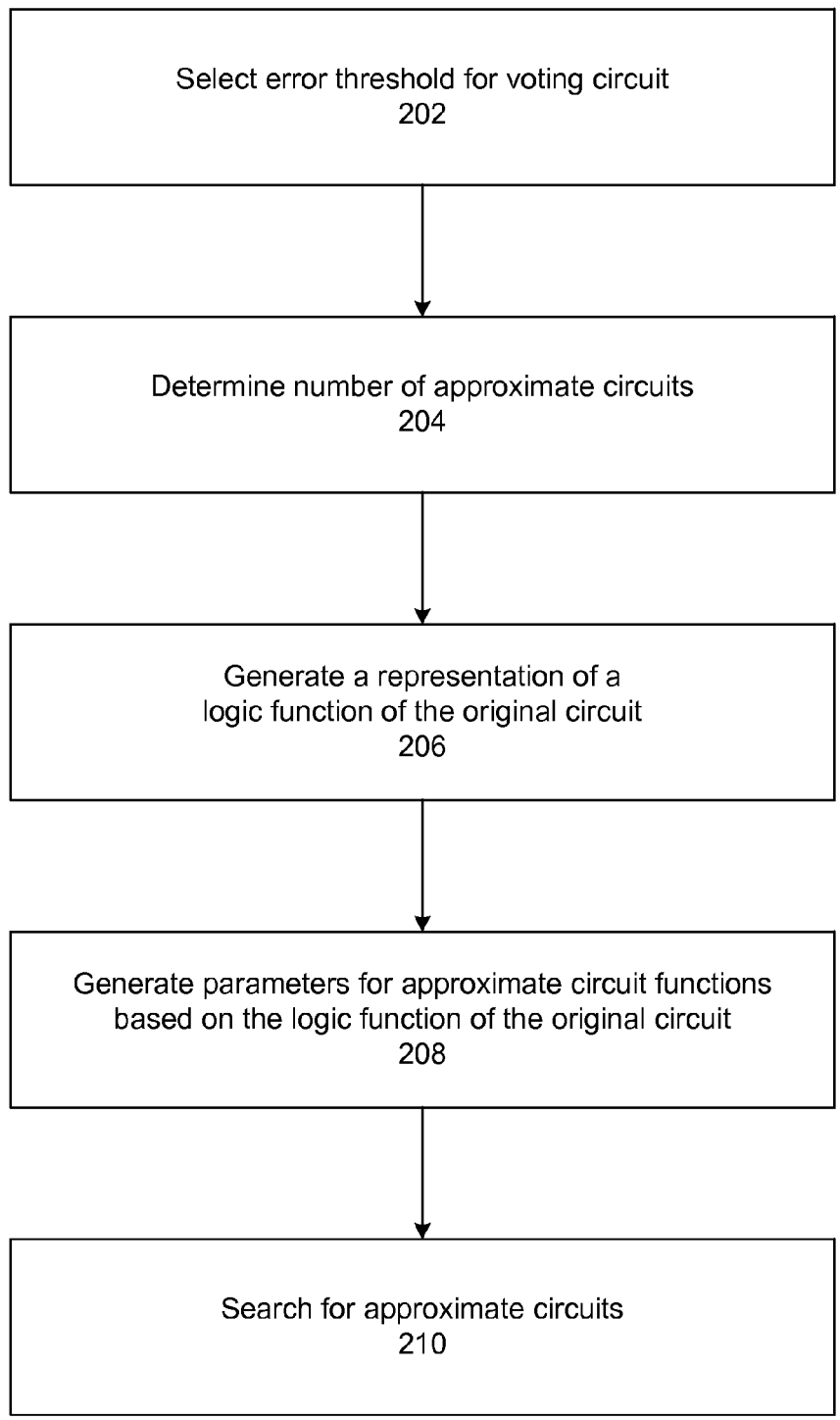
FIG. 2 is a flow diagram of a process for logic circuit synthesis according to an embodiment of the disclosure.

FIG. 2 is a flow diagram of a process for logic circuit synthesis according to an embodiment of the disclosure. As discussed below, a logic synthesis process may utilize a plurality of approximate circuits to generate the functionality of a specific logic circuit design (referred herein as an "original circuit" or "reference circuit"). Approximate circuits produce the designed behavior for many, but not all, of the possible input values for the original circuit. A voting circuit generates the output values specified by the original circuit by receiving the outputs generated by the plurality of approximate circuits and outputting a majority value of the received outputs (i.e., a Boolean majority function). The use of the Boolean majority function, in conjunction with the approximate circuits, provides for enhanced reliability against soft errors.

Process 200 includes operations for selecting an input error threshold for a voting circuit, 202. The Boolean majority function m utilized by said voting circuit may be expressed as m: $\{0, 1\} \mapsto \{0,1\}$ is defined by $m(p_1 \ldots p_n) = \lfloor \frac{1}{2} + (\Sigma^n_{i=1} p_i - \frac{1}{2})/n \rfloor$, where n in the above expression comprises the number of approximate circuits and $p_i$ comprises the output of each approximate circuit; in other words, the voting circuit produces as its output the value that appears on the majority of its inputs. Thus, it may correct as many (n−1)/2 errors at its inputs. For example, if five approximate circuits are used, the voting circuit may correct up to two errors at its inputs.

The number of approximate circuits to be used (i.e., n) is determined, 204. n may be selected based on the above described input error threshold. For example, if three approximate circuits are to be utilized, then at most one error total per output for the three approximate circuits may occur at any time. n may also be determined, for example, by the available space on an integrated circuit design, speed requirements for the original circuit design, power requirements for the original circuit design, etc.

Representations of the logic function (i.e., Boolean function) of the original circuit may be generated, 206. For example, given the description of the original circuit, a two-level sum of products (SoP) representation of the "on-set" patterns of the circuit (e.g., for single-bit circuit outputs, when the circuit output is '1') may be generated, and a two-level SoP representation of the off-set patterns of the circuit (e.g., for single-bit circuit outputs (when the circuit output is '0') may be generated. In other examples, different types of logic function representations (e.g., product of sums (PoS)) may be used. The on-set and off-set patterns may be switched prior to generating these representations.

In embodiments of the invention, at least some of the logic functions implemented in the plurality of approximate circuits are different than the original logic function; the logic functions for the plurality of approximate circuits are selected such that the majority value of the outputs generated by the plurality of approximate circuits and received by the voter circuit correspond to outputs of the original logic function.

A description of the approximate behavior is generated from the original circuit design, 208. As discussed above, approximate circuits produce the designed behavior for some, but not all, of the possible input values for the original circuit. For example, to generate a set of approximate circuits that, when combined with a majority voter, replicate the original circuit behavior, each SoP term (i.e., minterm) from the on-set patterns of the original circuit may be moved to the off-set patterns in one of the approximate circuits, and each disjoint SoP term from the off-set patterns of the original circuit may be moved to the on-set patterns in one of the approximate circuits.

Figure 3:
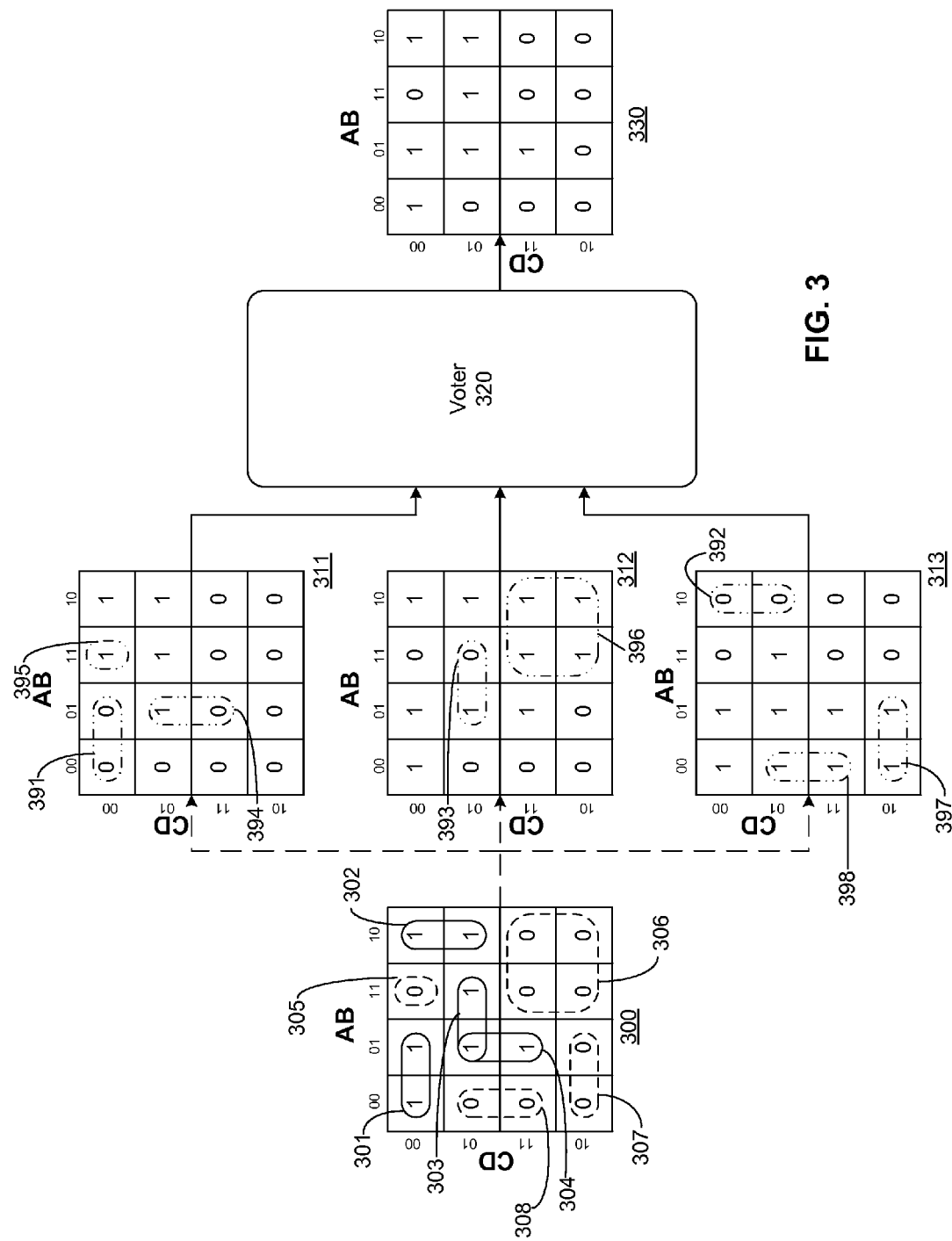
FIG. 3 is a functional illustration of approximate circuits used to provide enhanced reliability according to an embodiment of the disclosure.

Thus, when the original logic function of the original circuit comprises an SoP function, embodiments of the invention may select a logic function for each of the plurality of approximate circuits such that at least one SoP term of an on-set of the original logic function or at least one SoP term of an off-set of the original logic function is inverted. In some embodiments, the logic functions for each of the plurality of approximate circuits are selected such that each logic function inverts a SoP term of the original logic function. In some embodiments (as illustrated in FIG. 3 and described below) the logic functions for each of the approximate circuits are selected such that each of the SoP terms of the on-set of the original logic function and each of the SoP terms of the off-set of the original logic function are inverted in one of the approximate circuit logic functions.

In embodiments where the original logic function of the original circuit comprises a PoS logic function, a logic function for each of the plurality of approximate circuits is selected such that at least one maxterm of an on-set of the original logic function or at least one maxterm of an off-set of the original logic function is inverted. In some embodiments, the logic functions for each of the plurality of approximate circuits are selected such that each maxterm of the original logic function is inverted. In some embodiments the logic functions for each of the plurality of approximate circuits are selected such that each of the maxterms of the on-set of the original logic function and each of the maxterms of the off-set of the original logic function are inverted in one of the logic functions.

There are several possible processes for generating and searching collections of approximate circuits, 210. For example, if there are $t_0$ terms in the two-level off-set representation of the original circuit then there are $$\binom{t_1 + 3 - 1}{t_1}$$

ways to move these terms into the on-set of one of the approximate circuits. Likewise, if there are $t_1$ terms in the SoP representation of the on-set representation of the original circuit, then we have $$\binom{t_0+3-1}{t_0}\binom{t_1+3-1}{t_1} = \frac{m(m-1)n(n-1)}{4}$$

choices for moving these into the off-sets of the approximate circuits. Then there are $$\binom{t_0+3-1}{t_0}$$

collections of approximate circuits that are suitable for the original circuit design.

Considering all of these possibilities may allow for finding collections of approximate circuits that best satisfy some design goal, such as optimizing for reliability and area. However, in some embodiments, to simplify the process of finding suitable approximate circuits, an extensive guided search may be executed through this space using a small set of benchmark circuits. Then, using the results from these benchmarks, a set of heuristics may be developed that tend to produce better results; these heuristics are used to generate collections of approximate circuits for additional circuits.

For example, an initial guided search through the space of potential collections of approximate circuits may be based on several parameters to guide the search, including: (a) a minimum number of independent variables in an on-set term for it to be a candidate for moving to the off-set; (b) a maximum number of independent variables in an off-set term for it to be a candidate for moving to the on-set; (c) a percentage of the on-set terms that are allowed to be moved to the off-set in each of the approximate circuits; and (d) a percentage of the off-set terms that are allowed to be moved to the on-set in each of the approximate circuits. Varying these parameters may produce predictable reliability behavior while still simplifying the search for potential approximate circuits to be used.

As described below, in embodiments of the invention, each approximate circuit that is utilized is permitted to deviate from the behavior described by the original circuit specification—i.e., they approximate the specified functionality of the circuit. In embodiments of the invention, the approximate circuits are synthesized in such a manner that, when their outputs are combined by a majority voter, the voters' output matches the output description of the original design specification. Embodiments of the invention may thus produce approximations that are smaller than a standard synthesis of a circuit design and that are much more reliable.

FIG. 3 is a functional illustration of approximate circuits used to provide enhanced reliability according to an embodiment of the disclosure. In this example embodiment, an original circuit design comprises four inputs and one output, and three approximate circuits are used to enhance the reliability of the circuit design.

In this example, Karnaugh map (k-map) 300 describes the logic function of an original circuit design—i.e., the single bit output value for sixteen possible input values. Using an SoP designation, the on-set patterns included in k-map 300 are identified as minterms 301-304, while the off-set patterns are identified as minterms 305-308.

In order to select three possible approximate circuits that, when combined with majority voter 320, replicate the logic function output of the original circuit, each of minterms 301-304 from the on-set patterns may be moved to the off-set in one of the approximate circuits, and each of disjoint SoP terms 305-308 from the off-set patterns may be moved to the on-set in one of the approximate circuits.

In this embodiment, the use of three approximate circuits allows for an error threshold of one (i.e., (3−1)/2, per the equation discussed above). This error threshold results in using disjoint representations of the off-set patterns of the original circuit, but not of the on-set patterns, as each output bit may be inverted only once. If an output bit were to be included in more than one off-set term, and if those off-set terms were moved to the on-set in different approximate circuits, then that output bit would be inverted in more than one of the approximate circuits, introducing an incorrect output. This does not occur in this example when moving terms from the on-set to the off-set, because outputs included in more than one on-set term are only inverted when all of those on-set terms are moved to the offset. Other embodiments could generate disjoint SoP representations for the on-set patterns as well, although this introduces an additional computational overhead.

In this embodiment, k-maps 311-313 describe the logic function output of three different approximate circuits used. K-map 311 shows that the logic function output of the first approximate circuit produces the same output for many, but not all, possible input values of the original circuit. K-map 311 shows that for the first approximate circuit, minterm 301 from k-map 300 is moved from the on-set to the off-set (shown as minterm 391), minterm 304 from k-map 300 is moved from the on-set to the off-set (shown as minterm 394; however, the bit corresponding to term A'BC'D remains '1' because it is shared with minterm 303), and minterm 305 from k-map 300 is moved from the off-set to the on-set (shown as minterm 395).

K-map 312 shows that for the logic function output of the second approximate circuit, minterm 303 from k-map 300 is moved from the on-set to the off-set (shown as minterm 393; however, the bit corresponding to term A'BC'D remains '1' because it is shared with minterm 304), and minterm 306 from k-map 300 is moved from the off-set to the on-set (shown as minterm 396).

K-map 313 shows that that the logic function output of the third approximate circuit, minterm 302 from k-map 300 is moved from the on-set to the off-set (shown as minterm 392), minterm 307 from k-map 300 is moved from the off-set to the on-set (shown as minterm 397), and minterm 308 from k-map 300 is moved from the off-set to the on-set (shown as minterm 398).

Thus, in this embodiment, the logic functions for each of the plurality of approximate circuits inverts a different minterm from the on-set and the off-set, and all of said minterms are inverted exactly once in the plurality of approximate circuits. In other embodiments, this may vary—i.e., approximate circuits may invert the same minterm, some minterms may not be inverted in any approximate circuit, etc.

Voter circuit 320 receives the output from each of the three approximate circuits. In this figure, in the presence of no soft errors, it can be seen that for each of the possible sixteen input values, the output of voter circuit 320 (shown as k-map 330) matches the output of the original circuit (i.e., k-map 300).

In this embodiment, for the three approximate circuits described, a bit flip on an output of one of the approximate circuits may or may not propagate through voter circuit 320. For this example, a bit flip may occur on an output that belongs to one of three sets (a) a majority bit in a 3-0 vote; (b) a majority bit in a 2-1 vote; or (c) a minority bit in a 2-1 vote.

For this example, a single bit flip that occurs to an output belonging to sets (a) or (c) does not induce an error at the output of the voter, while a single bit flip occurring on an output in set (b) may produce an error.

Figure 4:
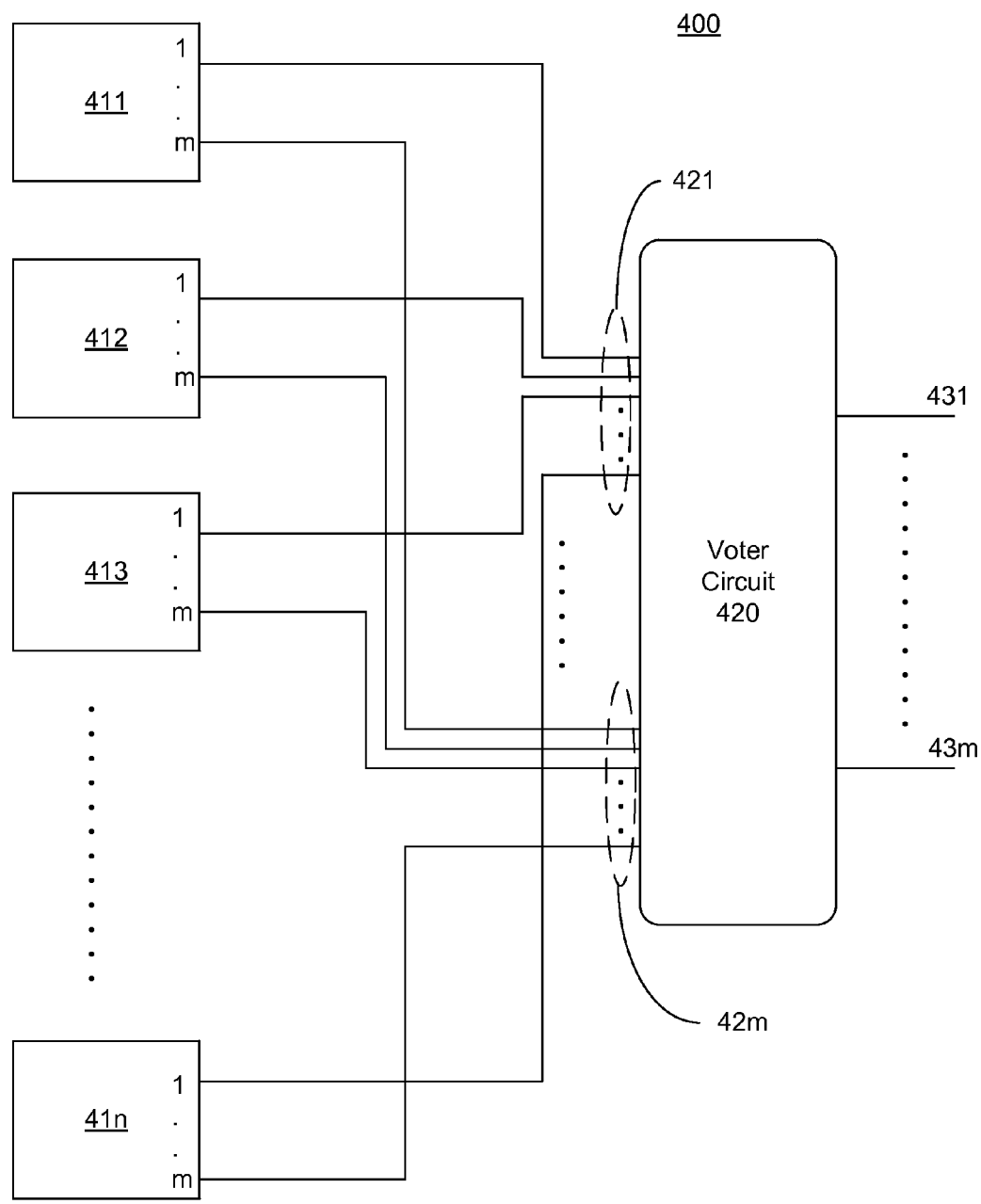
FIG. 4 is a block diagram of a plurality of approximate circuits used to provide enhanced reliability according to an embodiment of the disclosure.

FIG. 4 is a block diagram of a plurality of approximate circuits used to provide enhanced reliability according to an embodiment of the disclosure. In this embodiment, Boolean circuit 400 comprises approximate circuits 411-41$n$ and voter circuit 420. Boolean circuit 400 may be an integrated circuit or a digital circuit comprising several discrete components.

As discussed above, approximate circuits 411-41$n$ all receive the same input signals and are each based, in part, on a reference circuit that outputs m signals. Each of the approximate circuits are shown to similarly output m signals based on values of the received input signals. Voter circuit 420 receives the m output signals from each of approximate circuits 411-41$n$ (shown as signal groupings 421-42$m$, each signal grouping to comprise n signals) and outputs the majority value for each output signal (shown as output signals 431-43$m$).

As discussed above, at least some of approximate circuits 411-41$n$ are to generate output signal values different than the reference circuit for certain values of the receive input; however, for each possible value of the received input signals, the majority values of output signal groups 421-42$m$—i.e., the values of the voter circuit output signals 431-43$m$, correspond to output signal result values of the reference circuit.

In some embodiments, each of approximate circuits 411-41$n$ may comprises a different circuit design to generate different output signal values based on the values of the received input signals (i.e., "circuit diversity"). In other embodiments, it is possible for at least two of approximate circuits 411-41$n$ to comprise a same circuit design to generate the same output signal values based on the values of the received input signals (this is also possible in embodiments, for example, consisting of two copies of the reference circuit design and one version of a circuit that generates output signal values inverting all the output signal result values of the reference circuit.

In some embodiments, none of approximate circuits 411-41$n$ are to generate output signal values matching the output signal result values of the reference circuit. In other embodiments, one or more of approximate circuits 411-41$n$ are to generate output signal values matching the output signal result values of the reference circuit (i.e., the design/logic function of one or more approximate circuit may match the reference circuit).

In some embodiments, for each possible value of the received input signals, at least one of approximate circuits 411-41$n$ inverts the corresponding output signal result value of the reference circuit (this is illustrated in the example embodiment of FIG. 3). In other embodiments, some output signal result values of the reference circuit are not inverted (i.e., for at least one possible value of the received input signals, the one or more output signal results approximate circuits 411-41$n$ all match the corresponding output signal result value of the reference circuit).

Figure 5:
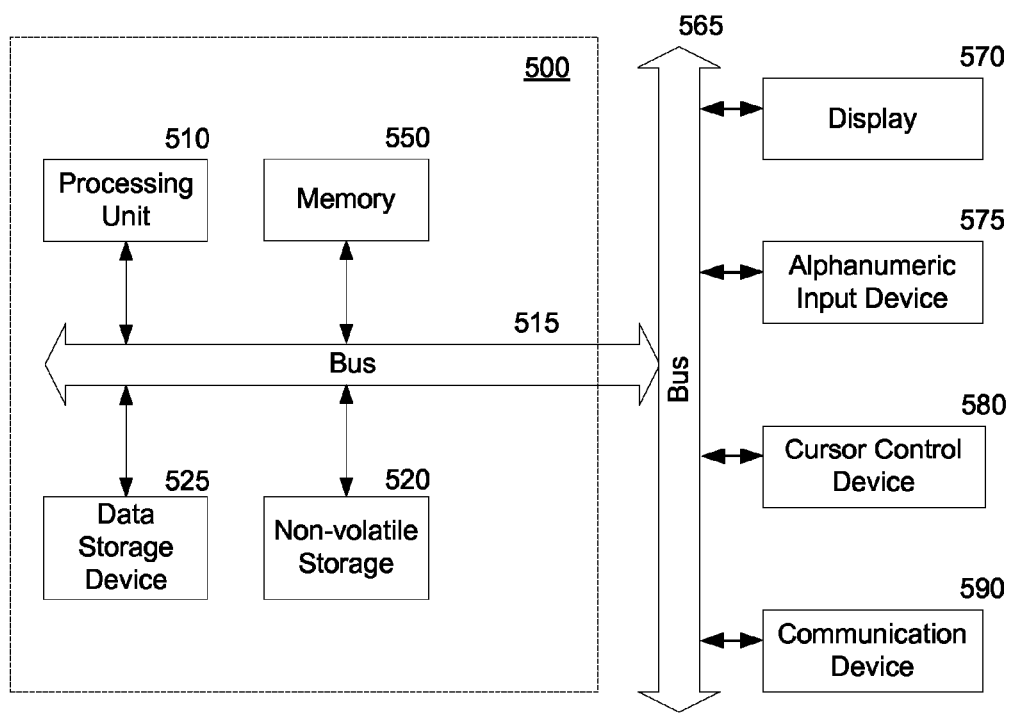
FIG. 5 is a block diagram of a computer system for performing digital circuit synthesis operations according to an embodiment of the disclosure.

FIG. 5 is a block diagram of a computer system for performing digital circuit synthesis operations according to an embodiment of the disclosure. Platform 500 may be used to execute any portion of the logic circuit synthesis process described above. Platform 500 as illustrated includes bus or other internal communication means 515 for communicating information, and processor 510 coupled to bus 515 for processing information. The platform further comprises random access memory (RAM) or other volatile storage device 550 (alternatively referred to herein as main memory), coupled to bus 515 for storing information and instructions to be executed by processor 510. Main memory 550 also may be used for storing temporary variables or other intermediate information during execution of instructions by processor 510. Platform 500 also comprises read only memory (ROM) and/or static storage device 520 coupled to bus 515 for storing static information and instructions for processor 510, and data storage device 525 such as a magnetic disk, optical disk and its corresponding disk drive, or a portable storage device (e.g., a universal serial bus (USB) flash drive, a Secure Digital (SD) card). Data storage device 525 is coupled to bus 515 for storing information and instructions.

Platform 500 may further be coupled to display device 570, such as a cathode ray tube (CRT) or an LCD coupled to bus 515 through bus 565 for displaying information to a computer user. In embodiments where platform 500 provides computing ability and connectivity to a created and installed display device, display device 570 may comprise any of the created and display devices described above. Alphanumeric input device 575, including alphanumeric and other keys, may also be coupled to bus 515 through bus 565 (e.g., via infrared (IR) or radio frequency (RF) signals) for communicating information and command selections to processor 510. An additional user input device is cursor control device 580, such as a mouse, a trackball, stylus, or cursor direction keys coupled to bus 515 through bus 565 for communicating direction information and command selections to processor 510, and for controlling cursor movement on display device 570. In embodiments utilizing a touch-screen interface, it is understood that display 570, input device 575 and cursor control device 580 may all be integrated into a touch-screen unit.

Another device, which may optionally be coupled to platform 500, is a communication device 590 for accessing other nodes of a distributed system via a network. Communication device 590 may include any of a number of commercially available networking peripheral devices such as those used for coupling to an Ethernet, token ring, Internet, or wide area network. Communication device 590 may further be a null-modem connection, or any other mechanism that provides connectivity between computer system 500 and the outside world. Note that any or all of the components of this system illustrated in FIG. 5 and associated hardware may be used in various embodiments of the disclosure.

It will be appreciated by those of ordinary skill in the art that any configuration of the system illustrated in FIG. 5 may be used for various purposes according to the particular implementation. The control logic or software implementing embodiments of the disclosure can be stored in main memory 550, mass storage device 525, or other storage medium locally or remotely accessible to processor 510. It will be apparent to those of ordinary skill in the art that any system, method, and process to capture media data as described herein can be implemented as software stored in main memory 550 or read only memory 520 and executed by processor 510. This control logic or software may also be resident on an article of manufacture comprising a computer readable medium having computer readable program code embodied therein and being readable the mass storage device 525 and for causing processor 510 to operate in accordance with the methods and teachings herein.

Embodiments of the disclosure may also be embodied in a handheld or portable device containing a subset of the computer hardware components described above. For example, the handheld device may be configured to contain only the bus 515, the processor 510, and memory 550 and/or 525. The handheld device may also be configured to include a set of buttons or input signaling components with which a user may select from a set of available options. The handheld device may also be configured to include an output apparatus such as a LCD or display element matrix for displaying information to a user of the handheld device. Conventional methods may be used to implement such a handheld device. The implementation of the disclosure for such a device would be apparent to one of ordinary skill in the art given the disclosure as provided herein.

Embodiments of the disclosure may also be embodied in a special purpose appliance including a subset of the computer hardware components described above. For example, the appliance may include processor 510, data storage device 525, bus 515, and memory 550, and only rudimentary communications mechanisms, such as a small touch-screen that permits the user to communicate in a basic manner with the device. In general, the more special-purpose the device is, the fewer of the elements need be present for the device to function.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The order in which some or all of the process blocks appear in each process should not be deemed limiting. Rather, one of ordinary skill in the art having the benefit of the present disclosure will understand that some of the process blocks may be executed in a variety of orders not illustrated.

The processes explained above are described in terms of computer software and hardware. The techniques described may constitute machine-executable instructions embodied within a machine (e.g., computer) readable storage medium, that when executed by a machine will cause the machine to perform the operations described. Additionally, the processes may be embodied within hardware, such as an application specific integrated circuit ("ASIC") or the like.

A computer-readable storage medium includes any mechanism that provides (e.g., stores) information in a form accessible by a machine (e.g., a computer, network device, personal digital assistant, manufacturing tool, any device with a set of one or more processors, etc.). For example, a computer-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A non-transitory computer readable storage medium including instructions that, when executed by a processor, cause the processor to perform a method comprising:

receiving a reference logic function for a reference circuit; and invoking a synthesis tool to synthesize:
  a plurality of approximate circuits based, at least in part, on the reference logic function; and
  a voter circuit to receive outputs generated by the plurality of approximate circuits, and to output a majority value of the received outputs generated by the plurality of approximate circuits;

wherein at least some of the logic functions implemented in the plurality of approximate circuits are different than the reference logic function, and wherein the logic functions for the plurality of approximate circuits are selected such that the majority value of the outputs generated by the plurality of approximate circuits and received by the voter circuit correspond to outputs of the reference logic function.

2. The non-transitory computer readable storage medium of claim 1, wherein the reference logic function of the reference circuit comprises a Sum of Products (SoP), and wherein the synthesis tool to further:
  select a logic function for each of the plurality of approximate circuits such that at least one minterm of an on-set of the reference logic function or at least one minterm of an off-set of the reference logic function is inverted.

3. The non-transitory computer readable storage medium of claim 2, wherein the synthesis tool to further:
  select the logic functions for each of the plurality of approximate circuits such that each logic function inverts a different at least one minterm of the on-set of the reference logic function or at least one minterm of the off-set of the reference logic function.

4. The non-transitory computer readable storage medium of claim 2, wherein the synthesis tool to further:
  select the logic functions for each of the plurality of approximate circuits such that each of the minterms of the on-set of the reference logic function and each of the minterms of the off-set of the reference logic function are inverted in one of the logic functions.

5. The non-transitory computer readable storage medium of claim 1, wherein the reference logic function of the reference circuit comprises a Product of Sums (PoS), and wherein the synthesis tool to further:
  select a logic function for each of the plurality of approximate circuits such that at least one maxterm of an on-set of the reference logic function or at least one maxterm of an off-set of the reference logic function is inverted.

6. The non-transitory computer readable storage medium of claim 5, wherein the synthesis tool to further:
  select the logic functions for each of the plurality of approximate circuits such that each logic function inverts a different at least one maxterm of the on-set of the reference logic function or at least one maxterm of the off-set of the reference logic function.

7. The non-transitory computer readable storage medium of claim 5, wherein the synthesis tool to further:
  select the logic functions for each of the plurality of approximate circuits such that each of the maxterms of the on-set of the reference logic function and each of the maxterms of the off-set of the reference logic function are inverted in one of the logic functions.

8. The non-transitory computer readable storage medium of claim 1, wherein the synthesis tool synthesizes each of the plurality of approximate circuits based on a different logic function.

9. The non-transitory computer readable storage medium of claim 1, wherein the plurality of approximate circuits comprises more than three circuits.

10. The non-transitory computer readable storage medium of claim 9, wherein the synthesis tool to synthesize at least two of the plurality of approximate circuits based on a same logic function.

11. The non-transitory computer readable storage medium of claim 1, the synthesis tool to synthesize the plurality of approximate circuits such that none of the plurality of approximate circuits are synthesized from the reference logic function.

\* \* \* \* \*